(12) United States Patent
Alfke et al.

(10) Patent No.: US 7,755,381 B1
(45) Date of Patent: Jul. 13, 2010

(54) REDUCING NOISE ON A SUPPLY VOLTAGE IN AN INTEGRATED CIRCUIT

(75) Inventors: Peter H. Alfke, Los Altos Hills, CA (US); Mark A. Alexander, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/359,902

(22) Filed: Jan. 26, 2009

(51) Int. Cl.
*H03K 17/16* (2006.01)
*H03K 19/003* (2006.01)

(52) U.S. Cl. .............................. 326/21; 326/22; 326/26; 326/33

(58) Field of Classification Search ........................ None
See application file for complete search history.

(56) References Cited

U.S. PATENT DOCUMENTS 4,714,924 A * 12/1987 Ketzler .................. 340/825.21
5,115,455 A * 5/1992 Samaras et al. ............. 375/354
7,170,324 B2 1/2007 Huber et al.

* cited by examiner

*Primary Examiner*—Anh Q Tran
(74) *Attorney, Agent, or Firm*—Scott Hewett

(57) ABSTRACT

An IC uses a tunable interconnect driver between a data source and a data destination to selectively slow down ("de-tune") data signals. Data sent along relatively short paths are de-tuned to reduce power supply noise during synchronous switching events. In some embodiments, the tunable interconnect driver delays data transmission relative to an un-delayed signal path, in other embodiments, the slew rate of the tunable interconnect driver is selectively reduced.

18 Claims, 7 Drawing Sheets

US 7,755,381 B1

REDUCING NOISE ON A SUPPLY VOLTAGE IN AN INTEGRATED CIRCUIT

FIELD OF THE INVENTION

The present invention generally relates to integrated circuits, and more particularly to techniques for reducing electrical noise on power supply voltages associated with switching events.

BACKGROUND OF THE INVENTION

Large, complex, integrated circuits ("ICs") incorporate millions of circuit elements, such as memory cells and transistors. Many of the transistors are typically used in switching circuits, connecting a data source to a data destination. One type of switch is commonly called a "flip-flop" or simply a "flop". It is generally desirable to operate the flops as fast as possible; however, several limitations can arise.

On physically large ICs, such as field-programmable gate arrays ("FPGAs"), data skew can occur between a flip-flop at one location on the IC and a flip-flop at another location. In a synchronous system, the data arriving at the two different flip-flops typically has to remain valid for each flop during a short portion of the clock cycle. The time allowed for all flip-flops in a clock domain to receive valid data during a clock cycle is called the "timing margin". Longer timing margins generally correspond to slower IC operation.

Many FPGAs and complex programmable logic devices ("CPLDs") employ techniques for reducing clock skew and flip-flop delay in order to achieve higher operating speeds. As a result, many flip-flops in a synchronous design switch almost simultaneously. This creates an impulse event ("spike") in the current drawn from an on-chip voltage supply, such as $V_{CC}$. The current spikes arising from a switching event cause fluctuations of the supply voltage, commonly called supply noise. Noise on a voltage supply typically increases the jitter on clock and data paths, eroding timing margins required for reliable circuit operation.

Techniques for reducing supply noise are desirable because less noise leads to reduced jitter, which improves timing margin, enhancing system robustness and enabling operation at higher clock frequencies.

SUMMARY OF THE INVENTION

An IC uses a tunable interconnect driver between a data source and a data destination to selectively slow down ("detune") data signals. Data sent along relatively short paths are de-tuned to reduce power supply noise caused by synchronous switching events. In some embodiments, the tunable interconnect driver delays data transmission relative to an un-delayed signal path, in other embodiments, the slew rate of the tunable interconnect driver is selectively reduced.

DETAILED DESCRIPTION

Figure 1:
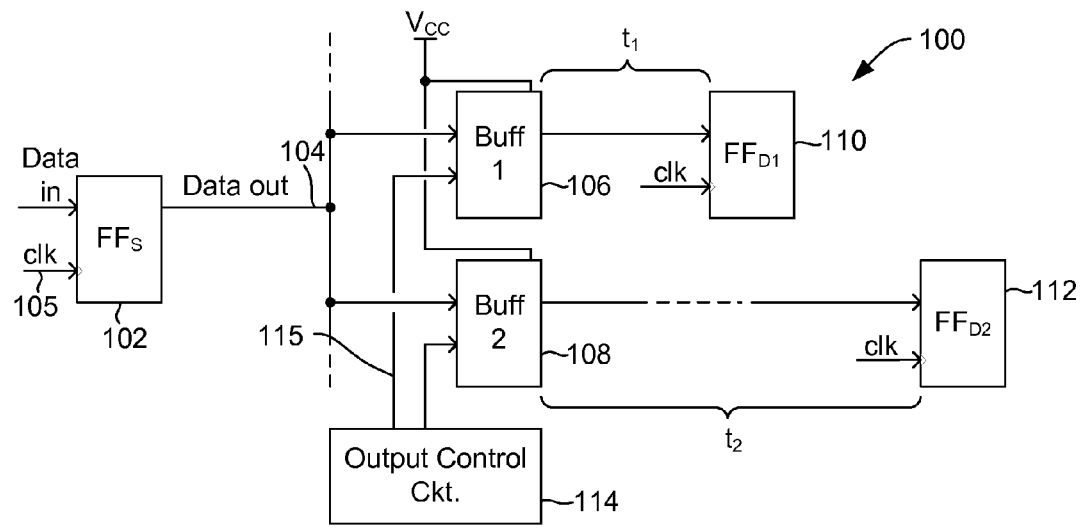
FIG. 1 is a circuit diagram of a portion of an IC according to an embodiment.

FIG. 1 is a circuit diagram of a portion of an IC 100 according to an embodiment. The IC is a configurable device, such as an FPGA or CPLD or a fixed-silicon device, such as an ASIC or microprocessor, for example. A data source 102, such as a flip-flop, logic node, memory cell, look-up table, or arithmetic logic unit, provides a digital data value (i.e., a digital value of one or a digital value of zero, or "datum") on a data line 104 to a first tunable interconnect driver 106 and to a second interconnect driver 108, which in a particular embodiment is a second tunable interconnect driver but is alternatively a fixed (conventional) interconnect driver and a clock signal on a clock signal input line 105. The term "output buffer" is commonly used to describe logic transmission elements within an IC, as well as to describe functional blocks (e.g., input/output buffer) of the IC itself (see, e.g., FIG. 6, ref. num. 604). For clarity of description, "interconnect driver" will be used to describe the transmission buffers, such as 106 and 108, in the illustrated logic circuits. The first tunable interconnect driver ("Buff 1") provides the digital data value to a first data destination 110, which is a flip-flop, logic input port, or a WRITE terminal of a memory cell for example, and the second interconnect driver 108 ("Buff 2") provides the digital data value to a second data destination 112, which may be the same type or a different type than the first data destination. Tunable interconnect drivers according to alternative embodiments are discussed in reference to FIGS. 2 and 3, below and allow selectively and intentionally the slowing down of data being transmitted to selected destinations (e.g., "de-tuning" the interconnect to achieve a phase offset (delay) or lower slew rate) so that the actual datum transmission time is greater than a nominal transmission time (e.g., the transmission time calculated by timing analyzing software assuming no intentionally added delay).

Transmitting data from the second interconnect driver 108 to the second data destination 112 takes a longer time ("transmittal time"), represented by bracket t2, than the time, represented by bracket t1, for transmitting data from the first tunable interconnect driver to the first data destination 110. The standard data transmittal time (e.g., the delay calculated by timing software run in conjunction with an electronic model (simulation) of the IC) will be referred to as the "nominal transmittal time", which means the time delay associated with a standard output driver and standard (e.g., synchronous) timing. Embodiments delay sending data or reduce the slew rate to slow data transmission to selected data destinations by de-tuning the associated interconnect drivers. The nominal transmittal time is the time expected if the interconnect driver is operating under standard (i.e., not de-tuned) conditions.

The difference in nominal data transmittal times typically arises due to the difference in physical distances on the IC separating the interconnect drivers from the data destinations (the longer distances requiring greater transmittal times), but can also arise due to differences in impedance characteristics, such as inductance along traces and through vias, and parasitic capacitances. Such differences are typically characterized using circuit simulation techniques and are accounted for when creating a configuration for the IC to operate an application. Often, overall IC performance (speed) achievable in an application is determined by a critical data path, which is typically the data path requiring the longest transmission time in a clock cycle.

Circuit simulators incorporating timing software are commonly used to estimate the delay of a specified signal along a specified path of the IC, and timing simulation is often done when evaluating configurations for circuit applications of an IC. Some paths will have tight timing constraints (e.g., a longer delay results in the data being received at the destination later in the data-valid window of the clock cycle, when only a small portion of the data-valid window is left), while other paths will have looser timing constraints (e.g., a shorter delay means the destination receives the correct data early in the data-valid window to). In many cases, a single data source will send its output to many data destinations, some near and some far. In a typical circuit, a data buffer (see, e.g., FIG. 1, ref. nos. 106, 108) is in the signal paths from the data source to the data sinks. For purposes of illustration and discussion only, an IC operating at a clock frequency of 500 MHz has a clock period of 2 nano-seconds. A typical data-valid window is about 150 pico-seconds. The data-valid window period is the short period in which a signal must arrive at its destination in order for the receiver to accurately capture the sent data, having accounted for all the clock skews, signal path delays, and jitter on the global clock signal.

The data interconnect drivers are typically close to the source, and the circuits are generally designed to operate at the maximum speed. In a conventional circuit, this means many data buffers are making and breaking low-impedance paths between an on-chip voltage supply, such as $V_{CC}$, and the signal path. Electronic noise on $V_{CC}$ is generated during the switching event, as explained above and discussed below in reference to FIGS. 4A-4D. The supply noise occurs when the data is sent, not when it arrives at the data destination. If the noise were generated when the data reached its destinations, the difference in delay between the various paths would distribute the time at which noise occurs, resulting in a lower maximum $V_{CC}$ excursion. However, when multiple interconnect drives operate simultaneously, the noise from each simultaneous switching event adds, leading to larger $V_{CC}$ excursions. The $V_{CC}$ excursions affect the delay encountered in transmitting clock and data signals, which adds jitter to the clock, relative to the data. This in turn requires a broadening of the timing specification and reducing performance.

De-tuning selected interconnect drivers to slow associated data outputs can reduce electronic noise generation on the power supply voltage and improve circuit performance. In an exemplary embodiment, hundreds or even thousands of flops operate in a synchronous fashion on a clock signal, and the cumulative effect of the noise and jitter produced is substantial. In one embodiment, tunable interconnect drivers delay transmittal of data to selected flops so that the buffer outputs are asserted shortly after other interconnect drivers assert data. In another embodiment, a tunable interconnect driver has a selectively reduced slew rate, which essentially slows down the assertion of the data signal. The delay and reduced slew rate are used in data paths having relatively short transit times (see, FIG. 1, ref. nums. t1, 110). These data destinations have relatively more time to secure the transmitted data than the destinations of longer paths. Supply voltage noise can be reduced and IC performance improved by de-tuning the interconnect drivers of the less-critical data destinations.

An interconnect driver control circuit 114 selectively controls the tunable interconnect drivers 106, 108 according to instructions from logic 116 in the IC. The interconnect driver control circuit 114 provides an interconnect driver control signal 115 to the tunable interconnect driver 106 de-tuning the interconnect driver so as to reduce noise on the voltage supply when a datum is sent from the data source to the data destination 112 by the interconnect driver 108.

Timing software (external to the IC 100) is used to determine whether an interconnect driver should be de-tuned according to the relative nominal transmittal times to the data destinations on the fan-out from the data source 102. In a particular embodiment, the IC includes a look-up table of delay factors for all paths in the device, which were determined by the circuit simulation and timing software. The nominal transmittal times are determined using a software simulator that calculates transmittal times for various paths or other techniques known in the art of IC timing design. For example, if all nominal transmittal times are long, no de-tuning is performed. However, if some nominal transmittal times are long and some are short, interconnect drivers in the short paths can be de-tuned to reduce noise on the voltage supply $V_{CC}$ without violating the timing requirement for the operation.

In a particular embodiment, the first tunable interconnect driver is connected to the first data destination through the fabric of an FPGA, and a second tunable interconnect driver is connected to the second data destination through the fabric of the FPGA. The data source, buffers, data destinations, and buffer output control logic are all contained on the IC chip. Typically, the data source 102 is switched in a synchronous fashion with several other data sources to corresponding data destinations on the same clock domain that need to stay aligned.

Figure 2:
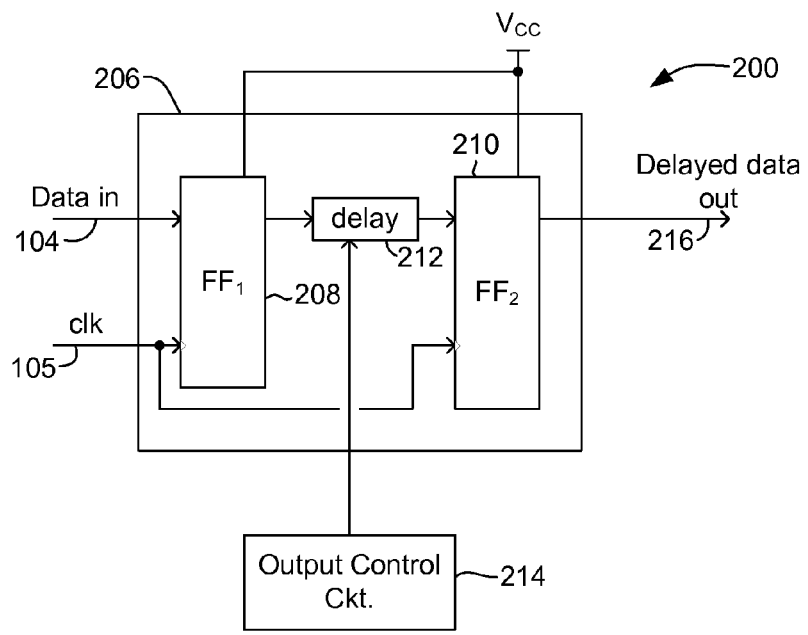
FIG. 2 is a circuit diagram of a portion of an IC with a delay-based tunable interconnect driver according to an embodiment.

FIG. 2 is a circuit diagram of a portion of an IC 200 with a delay-based tunable interconnect driver 206 (compare, FIG. 1, ref. num. 106) according to an embodiment. The tunable interconnect driver 206 has a first flip-flop 208 operating off a clock signal on a clock signal line 105 to receive data input from a data source (see, FIG. 1, ref. num. 102) on a data input line 104. A second flip-flop 210 holds data from the first flip-flop 208. A programmable delay line 212 delays the data signal from the first flip-flop 208 so that the second flip-flop 210 receives delayed data input after a selected time. Programmable delay lines are common in the art of FPGAs, and can be a series of latches with intermediate taps, for example. Each latch provides a known delay, and the delays add serially through the latches to provide the desired overall delay at a selected tap, which is coupled to the interconnect coupled to the input of the second flip-flop. Many other types of programmable delay lines could be used in alternative embodiments. A control circuit (logic) 214 selects the desired delay according to instructions provided by the user (typically based on the results of timing calculations performed by timing analyzer software) to offset the data from a synchronously switched parallel data path (see, FIG. 1, ref. num. 108, $t_2$) that is not selectively delayed. The delay is selected so as to shift the switching event associated with the first flip-flop 208 to a later portion of the data valid window (see, e.g., FIG. 4D) so that the noise associated with the switching event does not occur at the same time as flops connected to longer destinations, which need to be switched earlier. In a particular embodiment, many synchronous flops are asserted at the beginning of the data-valid period, and selected flops are delayed to reduce noise on the supply voltage providing current to the flip-flops in the driver circuit.

Figure 3:
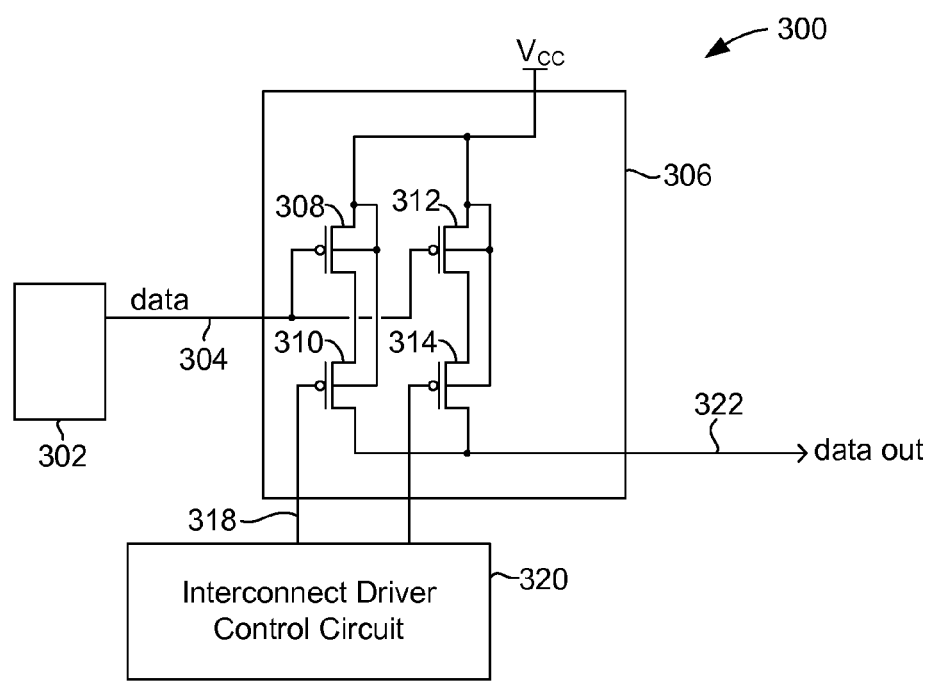
FIG. 3 is a circuit diagram of a portion of an IC with a slew rate-based tunable interconnect driver according to another embodiment.

FIG. 3 is a circuit diagram of a portion of an IC 300 with a slew rate-based tunable interconnect driver 306 according to another embodiment. A source 302 provides data to the tunable interconnect driver 306. The interconnect driver is a combinatorial or asynchronous driver, but could alternatively be a synchronous driver. The tunable interconnect driver has four PMOS FETs 308, 310, 312, 314. FETs 308 and 310 form a first current supply leg and FETs 312 and 314 form a second current supply leg. In each leg, the upper FET (e.g., 308) is turned ON (conducts) when the data signal 304 is HI. The lower FET (e.g., 310) is controlled by a control signal 318 from an interconnect driver control circuit 320 according to the desired drive level (slew rate) of the tunable interconnect driver 306. If a high drive current is desired, both legs are enabled by turning PMOS FETs 310 and 3140N. If less drive current is desired to produce less noise on power supply $V_{CC}$, only one of the legs is turned on, and the other leg kept OFF by the control signal from the interconnect driver control circuit. In one embodiment, each leg provides essentially equal amounts of current to drive the data output line 322, so that selecting both legs produces about twice as much drive current as selecting either leg by itself.

In an alternative embodiment, the FET widths or other characteristics are varied so that each leg produces a different amount of current. For example, one leg provides 4 mA of current and the other leg provides 8 mA. This allows the user to select a drive level of 4, 8, or 12 mA from the tunable output buffer. Different legs could use different gate widths, for example, to achieve different current drive levels. In a further embodiment, the interconnect driver control circuit 320 includes a delay feature so that one leg is turned on slightly later than the other, providing a stepped drive or "soft start" mode. In an alternative embodiment, only one leg is controlled by the interconnect driver control circuit 320, and the other leg is always ON, giving high and low drive levels. For example, transistor 314 is omitted and transistor 312 connected to the data out line 322 so that transistor 312 conducts whenever the data in signal is HI. Other tunable interconnect driver circuits are alternatively used.

The current drive level affects the slew rate of a data signal. A higher drive current increases the slew rate, while a lower drive current decreases the slew rate. The drive current can be reduced when transmitting data to data destinations that are close (in time) to the tunable interconnect driver because those data destinations will have a longer time (i.e., a greater portion of the data valid window) to capture the transmitted data value. For critical (e.g., longer) data paths, the high slew rate is enabled.

In a particular embodiment, one current supply leg is always ON when a data signal is HI, and another current supply leg is controlled by the interconnect driver control circuit 214 to be either ON or OFF, depending on whether a high or low slew rate is desired. This produces a simple control system for data destinations that are graded as either near or far, with the low slew rate (second current supply leg OFF) being selected for near data destinations.

Figure 4A:
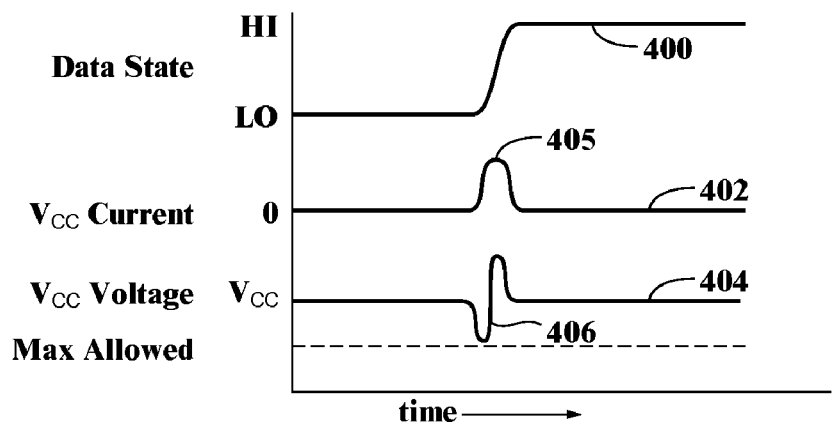
FIG. 4A shows plots illustrating power supply behavior for a conventional single switching event.

FIG. 4A shows plots illustrating power supply behavior for a conventional single switching event. The first plot 400 represents a data signal going from a LO state to a HI state. The second plot 402 represents the current drawn from the power supply (e.g., VCC) versus time as the data signal changes states with a peak current draw 405 at the time just after the data signal is asserted, and the third plot 404 represents the VCC voltage level with a representation of noise 406. These plots are merely illustrative of the events associated with switching, and therefore no scales are included; however, measured current and voltage would show substantially similar behavior.

Figure 4B:
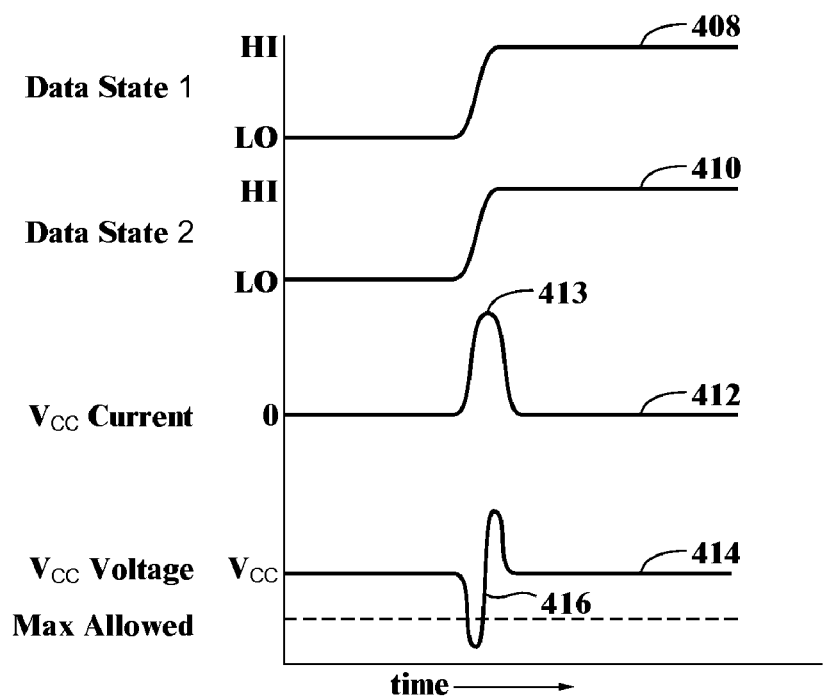
FIG. 4B shows plots illustrating power supply behavior for a conventional dual synchronous switching event.

FIG. 4B shows plots illustrating power supply behavior for a conventional dual synchronous switching event. The first two plots 408, 410 represent two data signals simultaneously going from a LO state to a HI state. The next plot 412 represents the current draw. Note that the peak current draw 413 is roughly twice the peak current draw for a single switching event. The next plot 414 represents the VCC voltage, and the noise 416 is greater than the noise 406 associated with a single switching event. Note that while the voltage excursion 406 does not exceed the arbitrary maximum allowed noise, the voltage excursion 416 representing multiple synchronous switching events exceeds the maximum allowed noise.

Figure 4C:
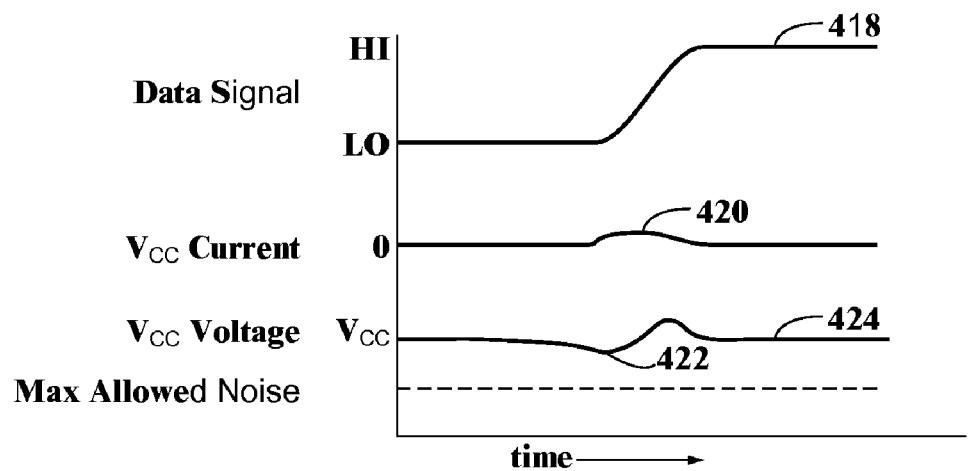
FIG. 4C shows plots illustrating a slew-modified switching event according to an embodiment.

FIG. 4C shows plots illustrating an intentionally slowed switching event according to an embodiment, such as can be obtained with a tunable interconnect driver allowing user-selectable slew rate, as is described in reference to FIG. 3. Note that the signal plot 418 takes longer to transition from a LO state to a HI state. This results in very little perturbation in the current plot 420, and very little noise 422 on the voltage plot 424.

Figure 4D:
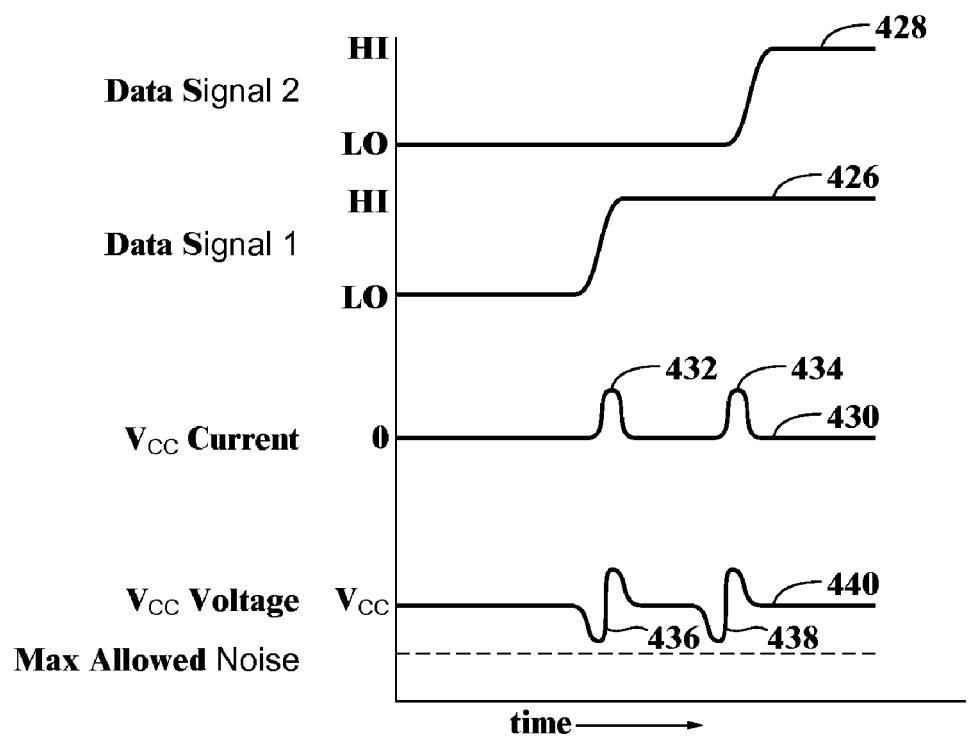
FIG. 4D shows plots illustrating power supply behavior for a phase-offset dual switching event according to an embodiment.

FIG. 4D shows plots illustrating power supply behavior for a phase-offset dual switching event according to an embodiment. As with FIG. 4B, two data signals 426, 428 are rapidly switched (i.e., high slew rate), but one signal 428 is delayed (phase offset) from the other signal 426. The resulting current plot 430 has two peaks 432, 434 at each of the switching events, each of the peaks 432, 434 being lower than the combined peak current draw 413 of FIG. 4B. Spreading the peak current draws out in time also spreads the noise 436, 438 on the voltage plot 440, and reduces the peak noise (compare FIG. 4B, ref. num. 416).

Figure 4E:
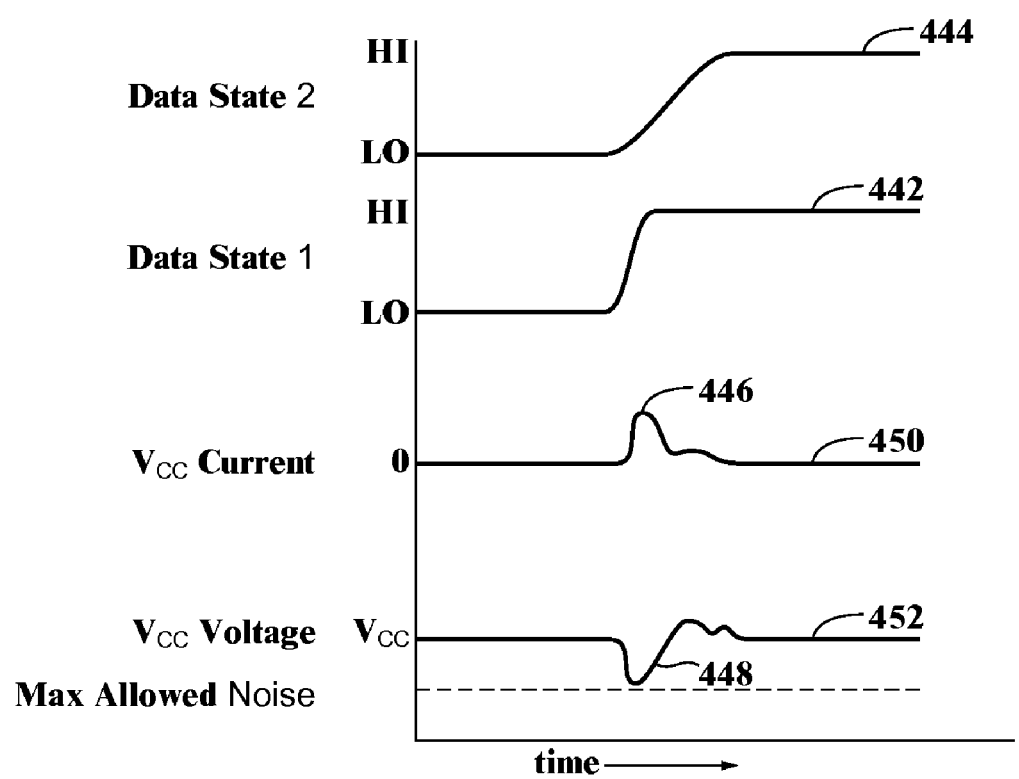
FIG. 4E shows plots illustrating power supply behavior for a slew-modified dual switching event according to an embodiment.

FIG. 4E shows plots illustrating power supply behavior for a slew-modified dual switching event according to an embodiment. A first data signal 442 is quickly switched (high slew rate) from LO to HI, while a second data signal 444 is simultaneously, but slowly (low slew rate) switched from LO to HI. Slowly switching the second data signal spreads out the current draw and the noise associated with the slow switching event (compare, FIG. 4C, ref. nums. 420, 422) to produce the current draw 446 and noise 448 shown in the plots representing supply current 450 and supply voltage 452. Note that unlike 416, the dual switching of 4E does not result in 448 exceeding the arbitrary maximum allowed noise.

Figure 5:
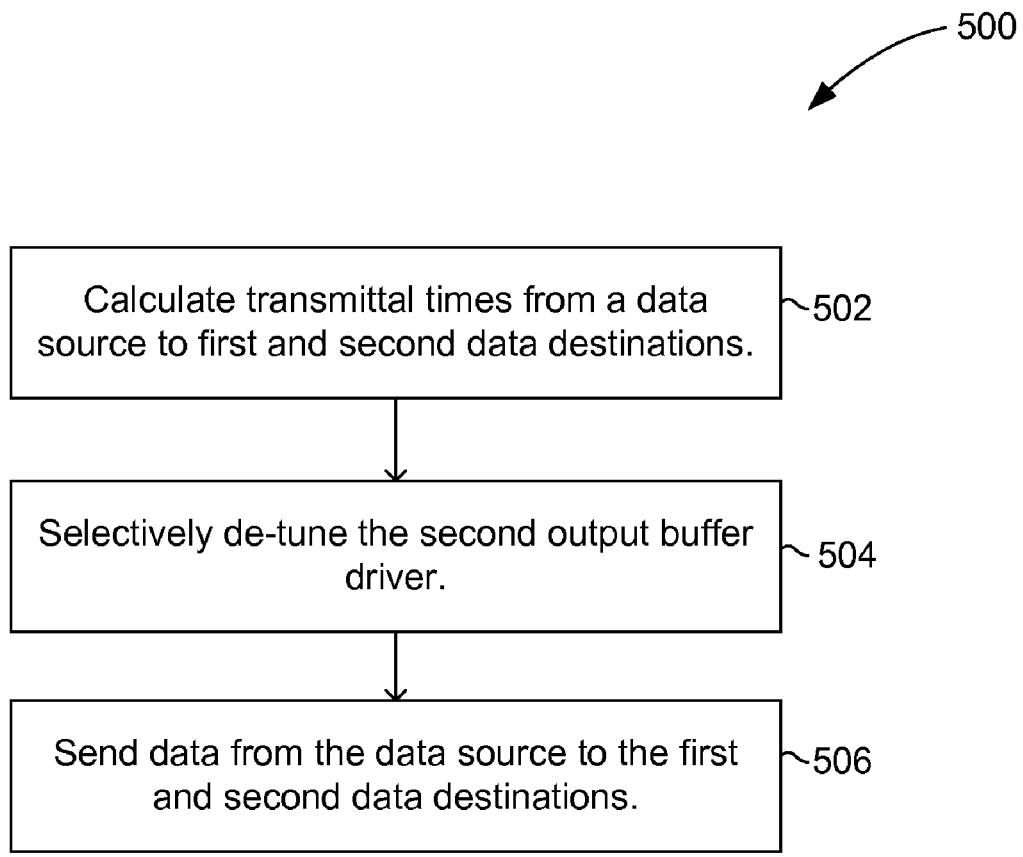
FIG. 5 is a flow chart of a method of operating an IC according to an embodiment.

FIG. 5 is a flow chart of a method 500 of operating an IC according to an embodiment. A first timing calculation is performed on the IC to determine a first data transmittal time (delay) between a data source (e.g., source flip-flop) to a first data destination and a second timing calculation is performed on the IC to determine a second data transmittal time (delay) between the data source to a second data destination (step 502) wherein the second data transmittal time is less than the first data transmittal time. The order of determining the transmittal times is not critical and may be reversed. Typically, timing simulation software calculates estimated delays for several data paths in the IC essentially simultaneously.

A tunable interconnect driver in the data path between the data source and the second data destination is selectively de-tuned (step 504) so as to reduce peak current draw from an on-chip voltage supply (e.g., $V_{CC}$) when data is sent from the data source to the first and second data destinations (step 506). In one embodiment, de-tuning is done by delaying the operation of the second tunable interconnect driver so that it sends the datum later than from the first interconnect driver. In an alternative embodiment, de-tuning is done by reducing the slew rate (current draw) of the second tunable interconnect driver. In a further embodiment, several transmittal times from the data source to several data destinations are calculated and sorted into at least two groups, the first group having data sent in a fast (nominal) manner, and the second group having data sent in a slow (de-tuned) manner so that each of the interconnect drivers associated with the second group operate in a manner that produces less current draw from the on-chip voltage supply.

Figure 6:
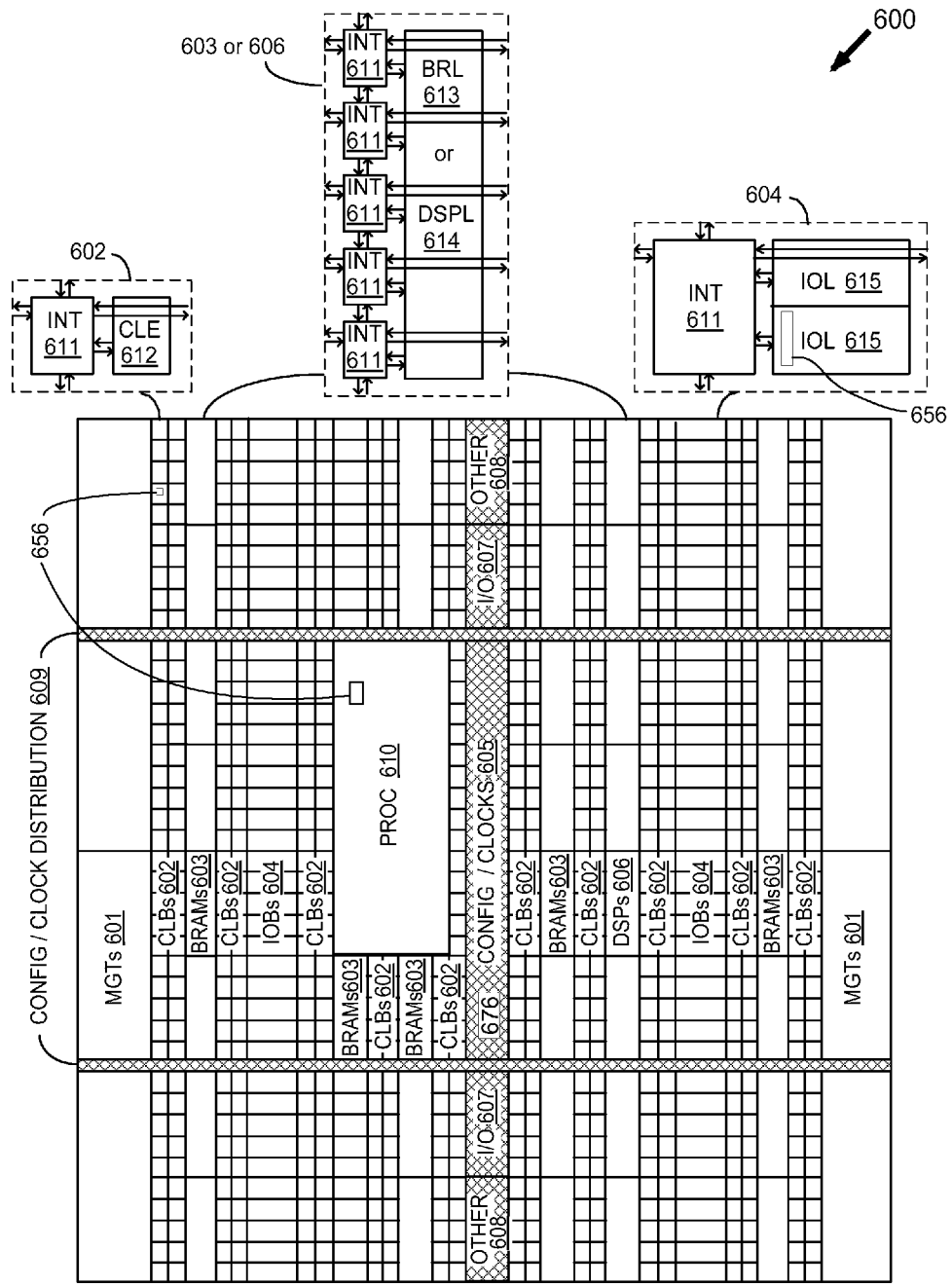
FIG. 6 is a plan view of an FPGA with interconnect drivers according to one or more embodiments of the invention.

FIG. 6 is a plan view of an FPGA with interconnect drivers according to one or more embodiments of the invention. The FPGA 600 includes CMOS portions in several of the functional blocks, such as in RAM and logic, and is fabricated using a CMOS fabrication process. One or more tunable interconnect drivers 656 and output control circuits 676 according to one or more embodiments of the invention are incorporated in any of several functional blocks of the FPGA, such as programmable interconnect 611, configurable logic block 602, processor 610, or other functional block; within many functional blocks; or within a physical section or segment of the FPGA 600. Tunable interconnect drivers 656 are particularly desirable for use in de-tuning (intentionally slowing) selected data transmission paths in FPGAs due to both the relatively long transmission paths and large number of transitioning nodes that often operate in the FPGA 600. Output control logic 676 is implemented in the configuration logic 605 or elsewhere.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An 10B 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die (shown shaded in FIG. 6) is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

The invention claimed is:

1. An integrated circuit ("IC") comprising:
   a voltage supply;
   a data source;
   a first data destination;
   a first tunable interconnect driver between the data source and the first data destination drawing a first peak supply current from the voltage supply when transmitting a datum from the data source to the first data destination;
   a first data path between the first tunable interconnect driver and the first data destination having a first nominal data transmittal time;
   a second data destination;
   a second tunable interconnect driver between the data source and the second data destination drawing a second peak supply current from the voltage supply when transmitting the datum from the data source to the second data destination;
   a second data path between the second tunable interconnect driver and the second data destination having a second nominal data transmittal time shorter than the first nominal data transmittal time; and
   an interconnect driver control circuit providing an interconnect driver control signal to the second tunable interconnect driver to de-tune the second tunable interconnect driver so as to reduce noise on the voltage supply when the datum is sent from the data source to the first data destination and to the second data destination.

2. The IC of claim 1 wherein the second tunable interconnect driver slows slew rate of the datum so that a second data transmittal time is greater than the second nominal data transmittal time.

3. The IC of claim 1 wherein the second tunable interconnect driver is a delay-based interconnect driver.

4. The IC of claim 3 wherein the delay-based interconnect driver includes:
   a first flip-flop receiving a datum on a data input line;
   a second flip flop; and
   a programmable delay line on a data path between the first flip-flop and the second flip flop providing a selected delay to produce a delayed datum output so as to offset the second peak supply current from the first peak supply current.

5. The IC of claim 1 wherein the second tunable interconnect driver is a slew rate-based tunable interconnect driver.

6. The IC of claim 5 wherein the slew rate-based interconnect driver includes a first current supply leg connected to the voltage supply and a second current supply leg connected to the voltage supply and controlled by the interconnect driver control circuit.

7. The IC of claim 5 wherein the second current supply leg is turned off by the interconnect driver control circuit when transmitting the datum to the second data destination.

8. The IC of claim 6 wherein the first current supply leg is also controlled by the interconnect driver control circuit.

9. The IC of claim 6 wherein the first current supply leg provides a first current and the second current supply leg provides the first current.

10. The IC of claim 6 wherein the first current supply leg provides a first current and the second current supply leg provides a second current.

11. The IC of claim 10 wherein the second current is at least twice the first current.

12. The IC of claim 6 wherein the interconnect driver control circuit delays turning on the second current supply leg a selected period after the datum is received by the slew rate-based tunable interconnect driver.

13. The IC of claim 6 wherein the interconnect driver control circuit turns on the first current supply leg and then turns on the second current supply leg.

14. A method of operating an integrated circuit ("IC") comprising:

calculating a first nominal transmittal time from a data source to a first data destination in the IC and a second nominal transmittal time from the data source to a second data destination in the IC wherein the second nominal transmittal time is less than the first nominal transmittal time;

selectively de-tuning an interconnect driver in a data path between the data source and the second data destination; and sending a datum from the data source to the first data destination and to the second data destination.

15. The method of claim 14 wherein the step of calculating the first nominal transmittal time and the second nominal transmittal time includes running timing software on an electronic circuit model of the IC.

16. The method of claim 14 wherein the step of selectively de-tuning the interconnect driver includes selectively setting a programmable delay line in a field-programmable gate array so that the interconnect driver sends the datum after the datum is sent to the first data destination.

17. The method of claim 14 wherein the step of selectively de-tuning the interconnect driver includes selectively reducing a slew rate of the interconnect driver.

18. The method of claim 14 wherein the step of calculating includes:

calculating a plurality of nominal transmittal times from the source to a corresponding plurality of data destinations, and further including, before sending the datum, sorting the plurality of data destinations into a first group and a second group, each of the data destinations in the second group having a shorter nominal transmittal time than any of the nominal transmittal times corresponding to data destinations in the first group.

* * * * *